US010520180B1

(12) United States Patent
Ji et al.

(10) Patent No.: US 10,520,180 B1
(45) Date of Patent: Dec. 31, 2019

(54) LAMP

(71) Applicants: Self Electronics Co., Ltd., Ningbo, Zhejiang (CN); Wanjiong Lin, Ningbo, Zhejiang (CN); Self electronics USA Corporation, Norcross, GA (US)

(72) Inventors: Feng Ji, Zhejiang (CN); Zhaoyong Zheng, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 16/442,159

(22) Filed: Jun. 14, 2019

(30) Foreign Application Priority Data

Jul. 4, 2018 (CN) .......................... 2018 1 0727471

(51) Int. Cl.

*F21V 23/00* (2015.01)
*H05K 1/18* (2006.01)
*H01L 33/48* (2010.01)

(52) U.S. Cl.

CPC .......... *F21V 23/005* (2013.01); *H01L 33/483* (2013.01); *H05K 1/18* (2013.01)

(58) Field of Classification Search

None

See application file for complete search history.

(56) References Cited

U.S. PATENT DOCUMENTS

2015/0362132 A1* 12/2015 McCane .................. F21K 9/90 362/235
2016/0069542 A1* 3/2016 Rao ......................... F21S 9/022 362/157
2018/0274734 A1* 9/2018 Cerce ...................... F21K 9/272

* cited by examiner

*Primary Examiner* — Dedei K Hammond
(74) *Attorney, Agent, or Firm* — Wang Law Firm, Inc.

(57) ABSTRACT

A lamp, including a lamp cover, the lamp cover is in the shape of a strip having openings at both ends, and the lamp cover is respectively provided with two side walls and a top surface along a direction away from the light emitting surface, and the two side walls and the top surface form an accommodating cavity; a PCB board, the PCB board being mounted in the accommodating cavity along the length direction of the lamp cover; the lamp also includes a conductive component connected to an external power supply, and the conductive component is electrically connected to the PCB board.

9 Claims, 5 Drawing Sheets

331 33 334 333 312 332 31 18 311 31 32 2 321 21 13 131 15 12 17 11 15 17 16 10

LAMP

RELATED APPLICATION

This application claims priority to a Chinese Patent Application No. CN 201810727471.0, filed on Jul. 4, 2018.

FIELD OF THE TECHNOLOGY

The present invention relates to lighting field, with particular emphasis on a lamp.

BACKGROUND OF THE INVENTION

With the development of electric power, lighting plays an increasingly important role in people's daily life. For example, LED lights play an important role in shopping malls, counters, bedrooms, shower rooms, etc.

Existing lighting devices, such as LED lamps, mainly use wires or wires on the PCB to connect to a power supply or the like. On the one hand, the structure needs to be equipped with too many wires, which leads to complicated structure of the lamp and inconvenient installation; on the other hand, because the wire needs to be hidden during the assembly process, it also needs to occupy a certain space inside the lamp, which causes the lamp to be bulky. It is not conducive to cost saving; at the same time, the structure of the cascading between the lamp body and the lamp body is complicated, resulting in a narrow application range.

Therefore, it is necessary to improve the structure of the lamp to solve all or at least some of the above technical problems.

BRIEF SUMMARY OF THE INVENTION

The purpose of the invention is to provide a lamp that is simple in construction, convenient to install, and that saves production costs.

In particular, a lamp includes:

a lamp cover, the lamp cover is in the shape of a strip having openings at both ends, and the lamp cover is respectively provided with two side walls and a top surface along a direction away from the light emitting surface, and the two side walls and the top surface form a accommodating cavity;

a PCB board, the PCB board being mounted in the accommodating cavity along the length direction of the lamp cover;

characterized in that:

the lamp also includes a conductive component connected to an external power supply, and the conductive component is electrically connected to the PCB board.

Advantageously, the conductive component includes a conducting plate having two support legs formed at one end thereof; The two support legs are embedded in corresponding holes on the PCB board respectively to electrically connect with the positive and negative electrode circuit of the PCB board, and the other end of the conducting plate is electrically connected with an external power supply. The elastic support legs have a better contact with the PCB than the wires and are easier to assemble.

Advantageously, the conducting plate is composed of a set of spaced elastic sheets and one end of the elastic sheets form the support legs.

Advantageously, the conductive component further includes a shim located below the conducting plate;

one side of the shim is provided with a rib formed along the length direction of the lamp cover;

the two support legs of the conducting plate are separated by the ribs. The shim can prevent the two support legs of the conducting plate from being gathered due to their elastic restoring force and resulting in difficulty in installation, and it is convenient to assemble and more efficiency.

Advantageously, the conductive component further includes a shim located below the conducting plate;

one side of the shim is provided with a rib formed along the length direction of the lamp cover;

the elastic sheets are respectively located on both sides of the ribs to form a spaced arrangement.

Advantageously, the conductive component further includes a fixing member which is matched fixed with the top surface and the two side walls respectively, and the lower end surface of the fixing member is concave toward to form a cavity;

the shim is fixed in parallel to the cavity along the length direction of the lamp cover, and the conducting plate is located between the shim and the cavity.

Advantageously, the conductive component is partially located in the accommodating cavity and partially located outside the accommodating cavity;

two sides of each end of the conducting plate are exposed outside the conductive component respectively;

the two side walls are provided with grooves formed along the length direction of the lamp cover;

grooves are provided with conductive rods electrically connecting to a corresponding side of the conducting plate exposed outside the conductive component to realize the cascade lamps to conduct electricity through the electrical connection between the conductive rod and the conductive plate when the lamps is cascaded. Through the simple cooperation of the conductive rod and the conducting plate, the connection between the lamp and the lamp is realized, and the problem that the connection of the plurality of interconnected lamps can be realized by the help of other conductive devices such as wires is avoided in the past, and the method is to embedded the conductive rod inside the lamp body. The lamp body space is rationally utilized, the lamp body design size is reduced, the structure is simple, the installation operation is convenient, and the cost is saved.

Advantageously, grooves are formed on two side walls between the PCB board and the top surface, and the conductive component is located between the PCB board and the top surface.

Advantageously, a plurality of light-emitting components are disposed on one side of the PCB board adjacent to the light emitting surface, and the other side of the PCB board is provided with corresponding holes for embedding the support legs.

Advantageously, the two side walls and the top surface are integrally formed by extending from both sides of the lamp cover along the direction away from the light emitting surface.

Compared with the prior art, the invention has the advantages that: connect with the external power supply through the conducting plate, the PCB board is supplied with power through the support leg of the conducting plate and the hole on the PCB board, thereby effectively avoiding the need to supply power to the lamp through wires in the past and the problems of inconvenient installation and complicated internal structure of the lamp due to the excessive winding of the lead; at the same time, a conductive rod capable of electrically connecting with the conducting plate is disposed on the inner wall of the lamp, and when the lamps are interconnected, a part of the conductive component of the lamp is located outside the lamp body, the conductive component of one lamp can be electrically contacted with the conductive rod in the other lamp through the corresponding side of the conducting plate exposed outside the conductive component. When one of the lamps is energized, all the lamps connected thereto can be obtained, thereby achieving conduction. This method effectively avoids the cumbersome problem of the lighting of the interconnecting lamps by means of wires on the PCB board or external wires, which makes the operation simple, and save time, labor and materials.

BRIEF DESCRIPTION OF THE DRAWINGS

The drawings described herein are intended to promote a further understanding of the present invention, as follows.

DETAILED DESCRIPTION OF THE INVENTION

Figure 1:
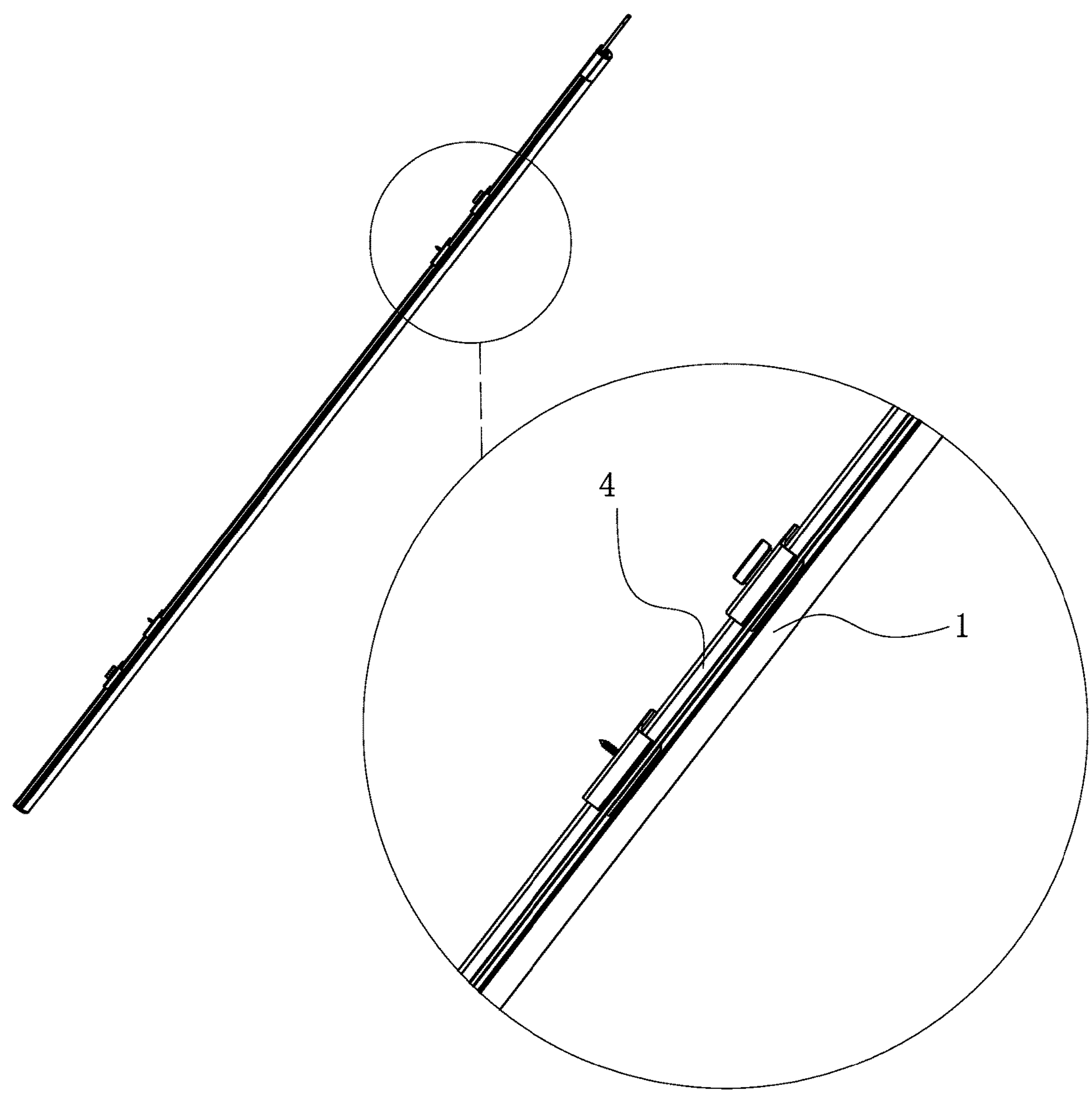
FIG. 1 is a structural diagram of an embodiment of a lamp of the present invention connected to an external power supply input.
Figure 2:
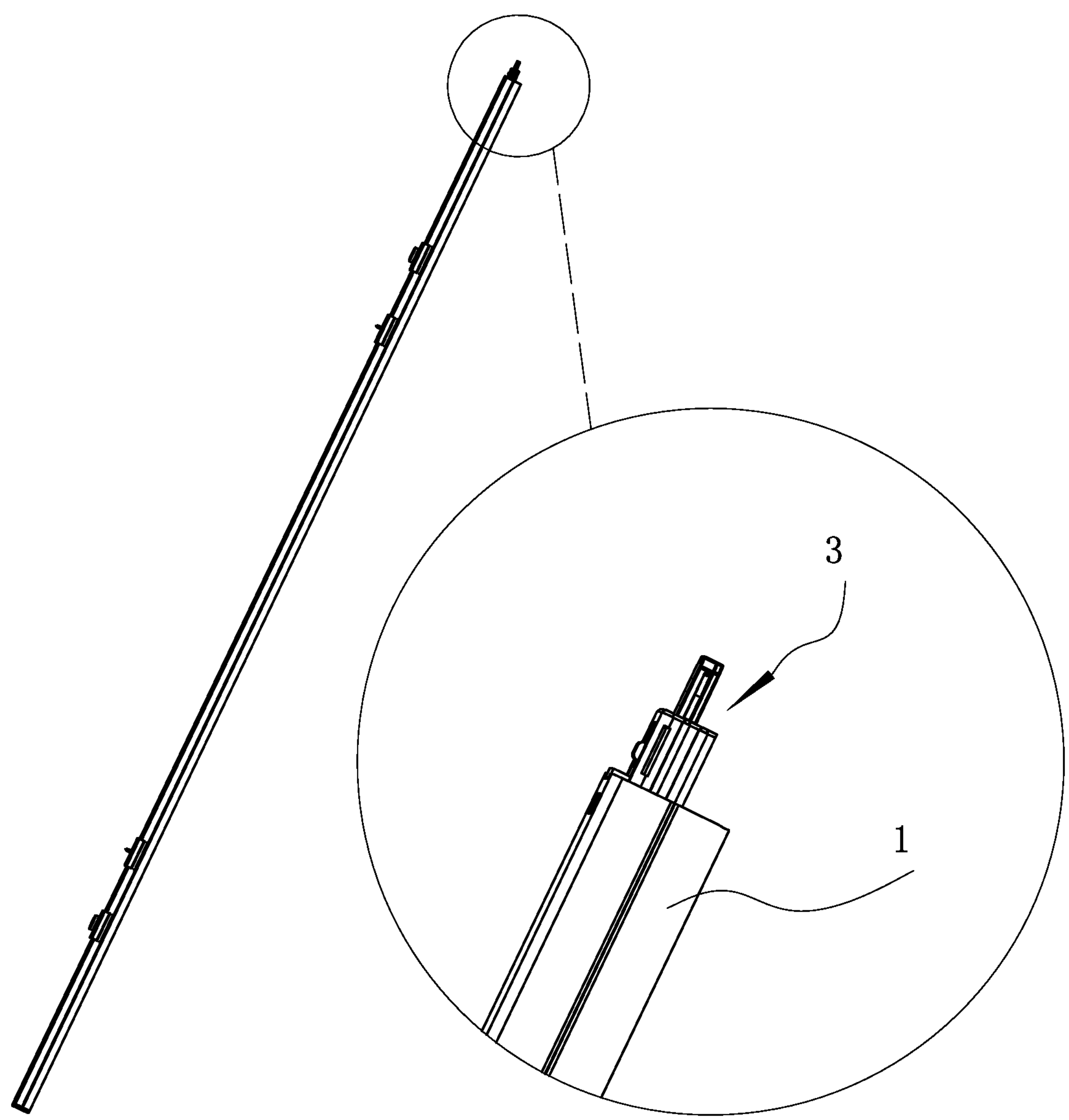
FIG. 2 is the corresponding structure diagram of FIG. 1 without external power supply input.

Embodiments of the invention are described in detail below, and examples of the embodiments are shown in the attached drawings, wherein identical or similar labels throughout denote identical or similar elements or elements having identical or similar functions. The embodiments described below by reference to the attached drawings are exemplary and are used only to interpret the invention and cannot be construed as restrictions to the invention.

An embodiment of the lamp of the present invention is shown in FIG. 1-5. The lamp is strip-shaped. Because different countries have different electrical safety requirements, the specific parameter settings of the lamp are not shown in this article. This can be determined according to the application environment and the requirements of the relevant countries, as it is not the main protection point of this application, it will not be detailed here.

The lamp includes a lamp cover 1, a PCB board 2 and a conductive component 3 connected to an external power supply. The lamp cover 1 has a strip shape with two open ends. The lamp cover 1 is respectively formed with two side walls 11, 12 and a top surface 13 along a direction away from the light emitting surface. The two side walls 11, 12 and the top surface 13 form an accommodating cavity 10; the PCB board 2 is assembly in the accommodating cavity 10 along the length direction of the lamp cover 1 and connected with external power supply by electrical connection with conductive component 3.

As shown in FIG. 2-5, in the embodiment, the light-emitting components of the lamp are located on the side of the PCB board 2 adjacent to the light emitting surface of the lamp cover 1. Of course, it is easy to know that the light-emitting component can also be located between the light emitting surface and the PCB board 2 and connected through wires and other electrical media. As long as the electrical connection between the light-emitting components and the conductive plate can be realized, it is within the scope of this application for protection. Meanwhile, in the present embodiment, the side walls 11, 12 and the top surface 13 are integrally formed by extending from both sides of the lamp cover 1 along the direction away from the light emitting surface. It should be noted that the side walls 11, 12 and the top surface 13 may also be designed separately from the lamp cover 1. For example, the side walls 11, 12 and the top surface 13 may be three corresponding sides of the unsealed frame body and both sides of lamp cover 1 can be connected with the side walls 11, 12 of the frame body by clamping, and such a structure facilitates the disassembly of the lamp body.

In this embodiment, the conductive component 3 includes a conducting plate 31 having two support legs 311, 312 formed at one end thereof, and two corresponding holes 21 are correspondingly disposed on the PCB board 2, and the two support legs 311,312 are respectively embedded in the corresponding holes 21, the conductive component 3 is electrically connected to the positive and negative electrode circuit of the PCB board 2 through the conducting plate 31. At the same time, the conductive component 3 is electrically connected to the external power supply through the other end of the conducting plate 31.

Figure 3:
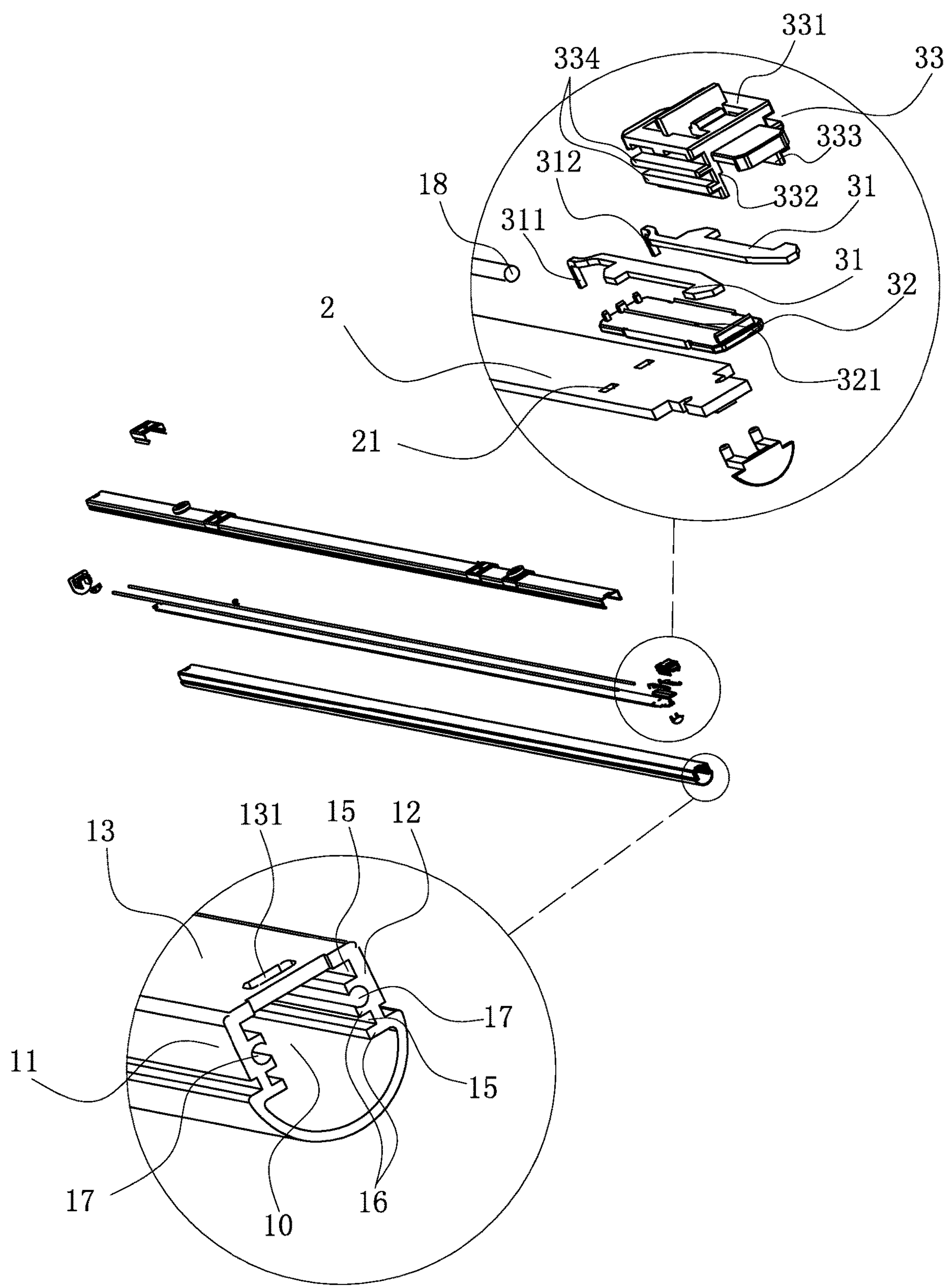
FIG. 3 is an explosion diagram of an angular structure of FIG. 2.

Of course, the other end of the conducting plate 31 can be integrally formed or can form two branches. At the same time, the conducting plate 31 may be composed of two elastic sheets and one end of each elastic sheet is in the shape of a leg as described above to be correspondingly connected with the corresponding holes 21, specifically to the embodiment, that is, the conducting plate 31 includes two spaced arranged elastic sheets as shown in FIG. 3.

Figure 4:
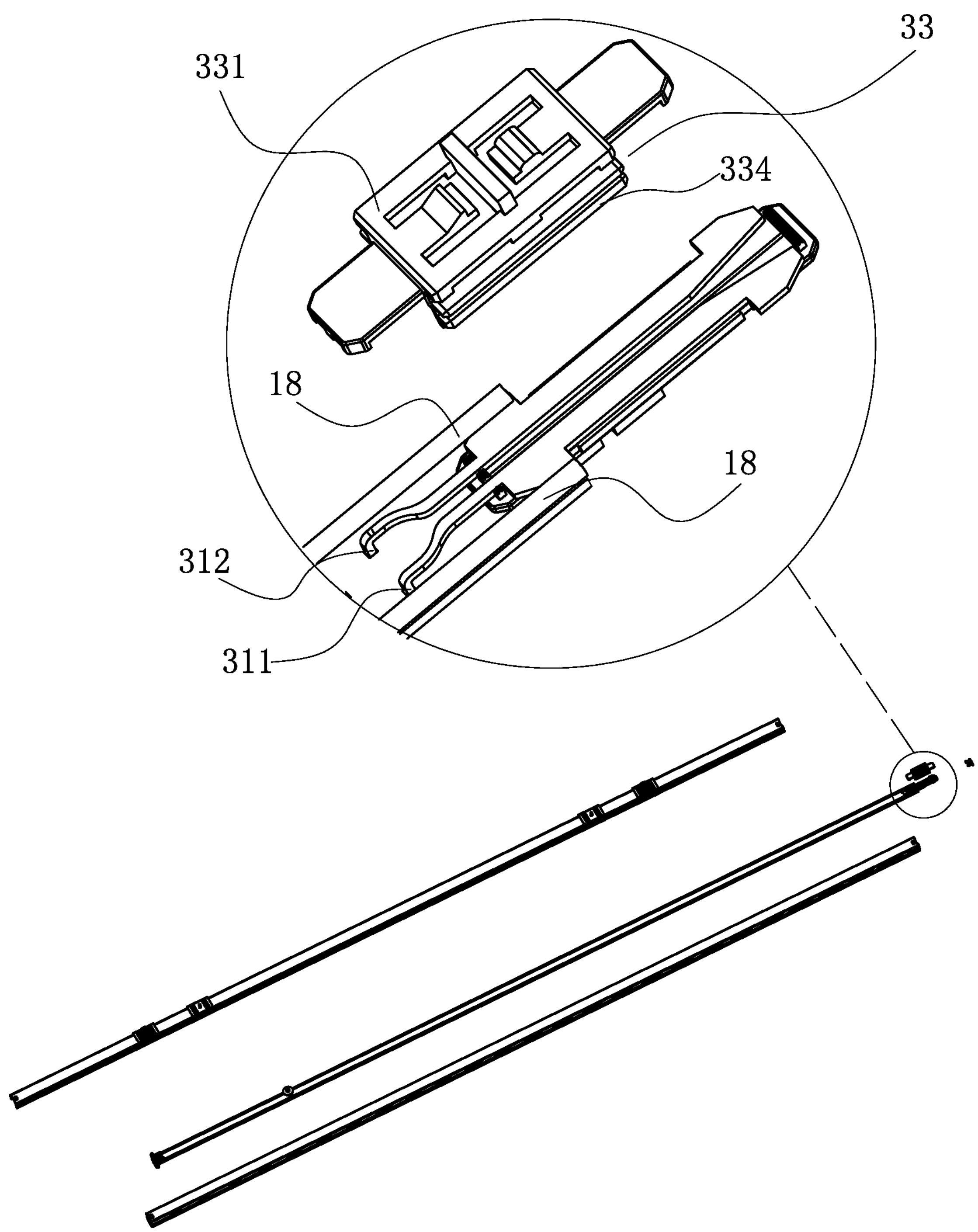
FIG. 4 is an explosion diagram of another angle structure of FIG. 2.
Figure 5:
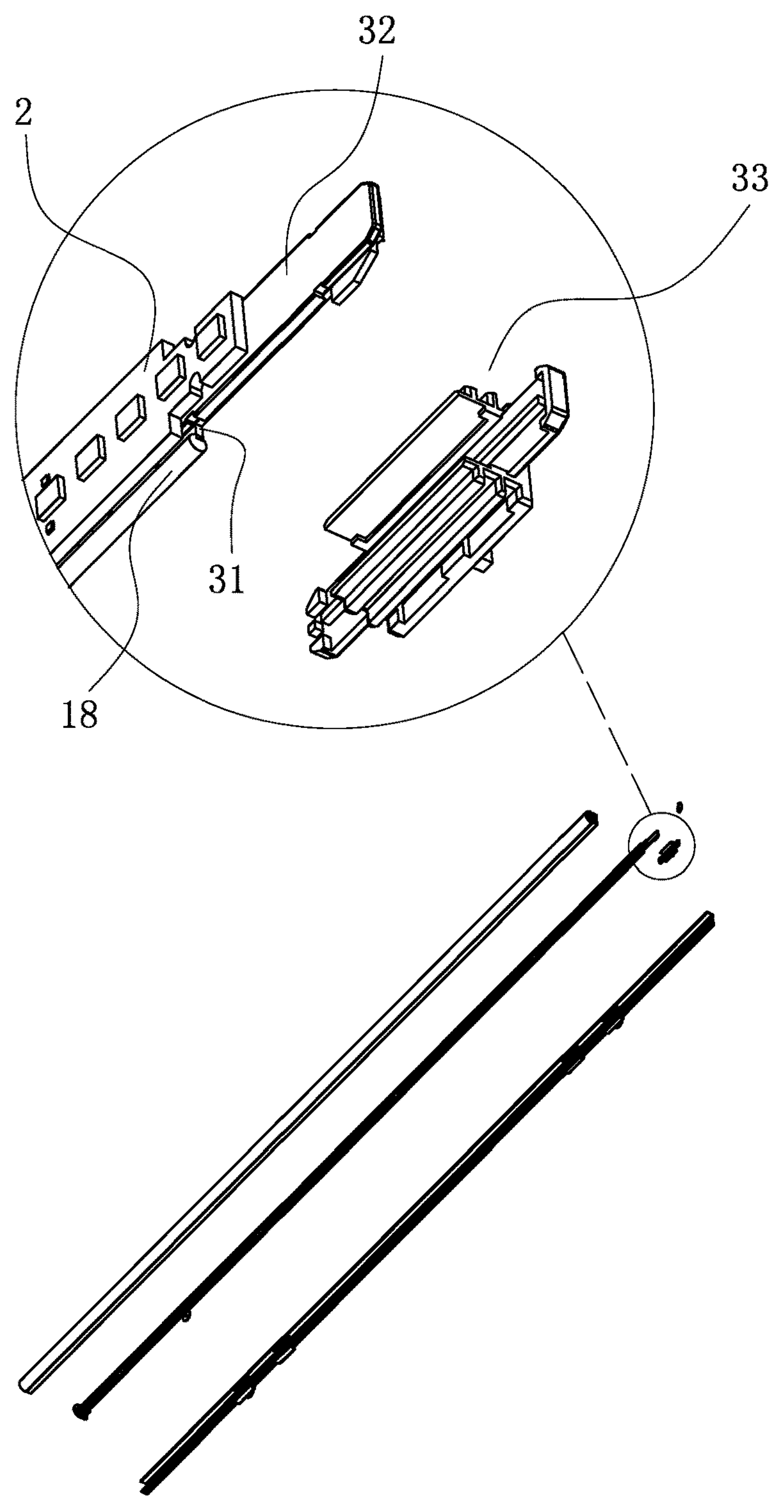
FIG. 5 is an explosion diagram of the further angle structure of FIG. 2.

In order to regulate the mounting structure, prevent the disorderly installation of conducting plate and PCB board, and improve the mounting efficiency, see FIG. 3-5 for details, the conductive component 3 also includes a shim 32 located below the conducting plate 31. one side of the shim 32 is provided with ribs 321 formed along the length direction of the lamp cover 1, and the two support legs 311, 312 of the conducting plate 31 are separated by the ribs 321, In this way, the shims can prevent the two branch legs of the conducting plates from coming together due to their own elastic restoring force, which makes installation difficult and improves assembly speed. When the conducting plate 31 is composed of two elastic sheets, the two elastic sheets are respectively located on both sides of the rib 321 of the shim 32 to form a spaced arrangement.

The support leg is electrically connected with PCB board. Compared with connecting PCB board with external power supply by using wires, the size of support leg is more standardized, and the molding degree is better, so it is easier to install. Meanwhile, compared with the wire, it has better contact effect.

In order to fix the conducting plate and the shim, the conductive component 3 of the lamp further includes a fixing member 33 which is fixed with the top surface 13 and the two side walls 11,12 respectively, and the lower end of the fixing member 33 is concave toward to form a cavity. The shim 32 is fixed in and parallel with the cavity along the length direction of lamp cover 1, and the conducting plate 31 is located between the shim 32 and the cavity. Referring to FIG. 3-4, the fixing member 33 has a plane 331 and side wall surfaces 332,333 extending downward from both sides of the plane. The side wall surfaces 332,333 are provided with a plurality of extending ribs 334, which are chimeric fixed with two side walls 11, 12. Correspondingly, the side wall 11 and the side wall 12 are formed with fixing grooves 15, and the top surface 13 has a mounting hole 131 for fixing the plane 331. It should be noted that the side of the fixing member 33 opposite to the conducting plate 31 is also provided with strip ribs disposed along the length direction of the lamp cover 1 to separate the conducting plates 31. In this embodiment, the fixing groove 15 is formed by the upper and lower parallel convex strips 16 formed on the side wall. It is easily conceivable that the fixing groove 15 can also be formed by the concave side wall along the length direction of the lamp cover 1.

Since the lamp may be interconnected according to the actual application situation, for example, in the counter of the mall, if the length of the counter is long and the lamp is short, a plurality of lamps are required to be assembled in a length direction to form a long strip lamp. In order to facilitate assembly and make the assembled lamps more beautiful, the conductive component 3 in the present application is partially located in the accommodating cavity 10, and partially is located outside the accommodating cavity, that is, partially located in the lamp cover 1, partially located outside the lamp cover 1, and at the same time, the two sides of each end of the conducting plate 31 are exposed outside the conductive component 3 respectively, in this embodiment, that is, the width of the two ends of the conducting plate 31 is wider than the fixing member 33, thus extending laterally beyond the fixing member 33, correspondingly, grooves 17 are formed in the side wall 11 and the side wall 12 along the length direction of the lamp cover 1, and conductive rods 18 are provided in the grooves 17 for electrically connecting to a corresponding side of the conducting plate 31 exposed outside the conductive component 3.

When the lamp and the lamp are cascaded, the length and width of the conductive component 3, the conducting plate 31, etc. are all designed according to actual needs, thus, the exposed conductive component 3 in one lamp is inserted into another lamp, and one end of the conductive rod 18 in the other lamp will contact the side of the conducting plate 31 in the lamp inserted into. And for the lamp itself, the other end of the conductive rod 18 will be electrically connected with the side of the conducting plate 31 located in the accommodating cavity. At the same time, because the lamp and the lamp are of the same size, a neat appearance of the lamp strip is formed when connected in turn. When one of the lamps is energized, due to the combination of the conductive rod 18 and the conducting plate 31, all the lamps connected in series will be electrically conductive.

Grooves are arranged in the side wall of the lamp for placing conductive rods. The cascading between the lamp and the lamp is realized by the combination of the contact between the conductive rod and the side of the conducting plate. This method not only enables the operator to realize the series conduction of lamps without the help of external devices, but also makes the cascade between lamps more beautiful. Moreover, conductive rods are embedded inside the lamp body to make reasonable use of the space of the lamp body, reduce the design size of the lamp body, and it has simple structure and convenient operation, improve the assembly efficiency and save the cost at the same time.

In this embodiment, the conductive rod 18 is made of copper. Of course, other conductive materials can be used. The groove 17 is formed on the sidewall between the PCB board 2 and the top surface 13. The conductive component is correspondingly located between the PCB board 2 and the top surface 13. At the same time, the outer periphery of the upper end of the lamp is also sleeved with a installing shell 4, and the size of the installing shell 4 is matched with the upper end portion of the lamp cover 1 and fixed. The specific connection mode and structure can be determined according to actual needs and no further details here.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. A lamp includes:

a lamp cover (1), the lamp cover (1) is in the shape of a strip having openings at both ends, and the lamp cover (1) is respectively provided with two side walls (11, 12) and a top surface (13) along a direction away from a light emitting surface, and the two side walls (11, 12) and the top surface (13) form an accommodating cavity (10);

a PCB board (2), the PCB board (2) being mounted in the accommodating cavity (10) along a lengthwise direction of the lamp cover (1);

characterized in that:

the lamp also includes a conductive component (3) connected to an external power supply, and the conductive component (3) is electrically connected to the PCB board (2);

wherein the conductive component (3) includes a conducting plate (31) having two support legs (311, 312) formed at one end thereof, and the two support legs (311, 312) are embedded in corresponding holes (21) on the PCB board (2) respectively to electrically connect with the positive and negative electrode circuits of the PCB board (2), and the other end of the conducting plate (31) is electrically connected with an external power supply.

2. The lamp as claimed in claim 1, wherein the conducting plate (31) is composed of a set of spaced elastic sheets and one end of the elastic sheets form the support legs.

3. The lamp as claimed in claim 2 wherein the conductive component (3) further includes a shim (32) located below the conducting plate (31);

one side of the shim (32) is provided with a rib (321) formed along the length direction of the lamp cover (1);

the elastic sheets are respectively located on both sides of the ribs (321) to form a spaced arrangement.

4. The lamp as claimed in claim 1, wherein the conductive component (3) further includes a shim (32) located below the conducting plate (31);

one side of the shim (32) is provided with a rib (321) formed along the length direction of the lamp cover (1);

the two support legs (311, 312) of the conducting plate (31) are separated by the ribs (321).

5. The lamp as claimed in claim 4 wherein the conductive component (3) further includes a fixing member (33) which is matched fixed with the top surface (13) and the two side walls (11, 12) respectively, and the lower end surface of the fixing member (33) is concave toward to form a cavity;

the shim (32) is fixed in parallel to the cavity along the length direction of the lamp cover (1), and the conducting plate (31) is located between the shim (32) and the cavity.

6. The lamp as claimed in claim 1, wherein the conductive component (3) is partially located in the accommodating cavity (10) and partially located outside the accommodating cavity (10);

two sides of each end of the conducting plate (31) are exposed outside the conductive component (3) respectively;

the two side walls (11, 12) are provided with grooves (17) formed along the length direction of the lamp cover (1);

grooves (17) are provided with conductive rods (18) electrically connecting to a corresponding side of the conducting plate (31) exposed outside the conductive component (3) to realize the cascade lamps to conduct electricity through the electrical connection between the conductive rod (18) and the conductive plate (31) when the lamps is cascaded.

7. The lamp as claimed in claim 6 wherein grooves (17) are formed on two side walls (11, 12) between the PCB board (2) and the top surface (13), and the conductive component (3) is located between the PCB board (2) and the top surface (13).

8. The lamp as claimed in claim 1 wherein a plurality of light-emitting components are disposed on one side of the PCB board (2) adjacent to the light emitting surface, and the other side of the PCB board is provided with corresponding holes (21) for embedding the support legs (311, 312).

9. The lamp as claimed in claim 1 wherein the two side walls (11, 12) and the top surface (13) are integrally formed by extending from both sides of the lamp cover (1) along the direction away from the light emitting surface.

* * * * *